(12) United States Patent
Labuschagne et al.

(10) Patent No.: US 7,425,778 B2
(45) Date of Patent: Sep. 16, 2008

(54) APPARATUS AND METHOD FOR COMPENSATING SECONDARY CURRENTS USED IN DIFFERENTIAL PROTECTION TO CORRECT FOR A PHASE SHIFT INTRODUCED BETWEEN HIGH VOLTAGE AND LOW VOLTAGE TRANSFORMER WINDINGS

(75) Inventors: Casper Labuschagne, Pullman, WA (US); Normann Fischer, Colfax, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 543 days.

(21) Appl. No.: 11/188,237

(22) Filed: Jul. 22, 2005

(65) Prior Publication Data

US 2007/0021937 A1    Jan. 25, 2007

Related U.S. Application Data

(60) Provisional application No. 60/671,370, filed on Apr. 14, 2005.

(51) Int. Cl.
G01R 19/00 (2006.01)

(52) U.S. Cl. ...................................................... 307/14
(58) Field of Classification Search .................. 307/14; 324/107; 361/61
See application file for complete search history.

(56) References Cited

U.S. PATENT DOCUMENTS

| | | | |
|---|---|---|---|
| 4,758,774 A | 7/1988 | Crawford et al. | |
| 5,014,153 A | 5/1991 | Wilkerson | |
| 5,276,402 A | 1/1994 | Schucht | |
| 5,309,312 A | 5/1994 | Wilkerson | |
| 5,790,357 A * | 8/1998 | Schiel | ......................... 361/36 |
| 6,507,184 B1 * | 1/2003 | Elston | ......................... 324/107 |

FOREIGN PATENT DOCUMENTS

WO    WO 01/17150 A1    8/2000

OTHER PUBLICATIONS

Mike Young, John Horak, "Commissioning Numerical Relays," Basler Electric Company, Highland Illinois USA.
The Self-Adaption Compensated Differential Protection of Powerformer by Xiangning Lin, Qing Tian and Pei Liu of the Department of Electrical Engineering, Huazhong University of Science and Technology (HUST), Wuhan 430074, China date not available.

(Continued)

Primary Examiner—Michael J Sherry
Assistant Examiner—Adi Amrany
(74) Attorney, Agent, or Firm—Eugene M. Cummings, P.C.

(57) ABSTRACT

Provided is an apparatus and method for providing to a differential relay an operational vector-group compensation setting pair that automatically provides correction for a phase shift occurring between currents of at least two windings of a power transformer. The method includes calculating a first and second plurality of phasors using secondary currents derived from respective first and second winding of the at least two windings. The method also includes selecting one pair of vector-group compensation settings based on operate current values calculated using different pair combinations of the vector-group compensation settings applied to the first and second plurality of phasors. The method further includes comparing phase angles of like-phase phasors to determine if the phase angles are within a pre-determined angle range, and enabling application of the selected pair of vector-group compensation settings as the operational vector-group compensation setting pair if the phase angles are within the pre-determined angle range.

47 Claims, 8 Drawing Sheets

OTHER PUBLICATIONS

Ways to Assure Improper Operation Of Transformer Differential Relays by Walter A. Elmore, Consulting Engineer, ABB Power T&D Co., Inc., Coral Spring, Florida presented to the Forty-Fifth Annual Conference For Protective Relaying Engineering at the Georgia Institute of Technology in Atlanta, Georgia on May 1-3, 1991.

Solutions For Unconventional CT Connections by Gerald Dalke, Basler Electric COmpany presented before the 59th Annual Georgia Tech Protective Relaying Conference in Atlanta, Georgia on Apr. 27-29, 2005.

* cited by examiner

Commissioning Report 350

```
0         1         2         3         4         5         6         7
1234567890123456789012345678901234567890123456789012345678901234567890

<Standard Heading>

Automatic Matrix Selection Successful.

Phase Rotation: ABC              ___ 352
Reference Winding: Winding Z
Matrix assigned to Winding Z: Matrix 12

Test Winding: Winding X
Matrix auto-selected for Winding X: Matrix Y

With the present matrices, the differential measurements are:
IOP1(pu)           IOP2(pu)           IOP3(pu)
0.00               0.00               0.00              ___ 354

IRT1(pu)           IRT2(pu)           IRT3(pu)
00.00              00.00              00.00

With the auto-selected matrices, the differential measurements are:
IOP1(pu)           IOP2(pu)           IOP3(pu)
0.00               0.00               0.00              ___ 356

IRT1(pu)           IRT2(pu)           IRT3(pu)
00.00              00.00              00.00

A-phase Values From All Matrices (Winding Z Matrix: Matrix 12)
        Matrix 1                       Matrix 2
IOP1(pu)     IRT1(pu)          IOP1(pu)     IRT1(pu)    ___ 358
0.00         0.00              0.00         0.00

Matrix 3                       Matrix 4
IOP1(pu)     IRT1(pu)          IOP1(pu)     IRT1(pu)
0.00         0.00              0.00         0.00

Matrix 5                       Matrix 6
IOP1(pu)     IRT1(pu)          IOP1(pu)     IRT1(pu)
0.00         0.00              0.00         0.00

Matrix 7                       Matrix 8
IOP1(pu)     IRT1(pu)          IOP1(pu)     IRT1(pu)
0.00         0.00              0.00         0.00

Matrix 9                       Matrix 10
IOP1(pu)     IRT1(pu)          IOP1(pu)     IRT1(pu)
0.00         0.00              0.00         0.00

Matrix 11                      Matrix 12
IOP1(pu)     IRT1(pu)          IOP1(pu)     IRT1(pu)
0.00         0.00              0.00         0.00

Assign auto-selected matrices to Winding Z and Winding X? (Y,N)
```

APPARATUS AND METHOD FOR COMPENSATING SECONDARY CURRENTS USED IN DIFFERENTIAL PROTECTION TO CORRECT FOR A PHASE SHIFT INTRODUCED BETWEEN HIGH VOLTAGE AND LOW VOLTAGE TRANSFORMER WINDINGS

CROSS-REFERENCE TO RELATED APPLICATIONS

This application claims benefit under 35 U.S.C. §119(e) of U.S. Provisional Application Ser. No. 60/671,370, entitled "An Apparatus and Method for Compensating Secondary Currents Used in Differential Protection to Correct for a Phase Shift Introduced Between High Voltage and Low Voltage Transformer Windings", filed on Apr. 14, 2005, naming Casper Labuschagne as inventor, the complete disclosure thereof being incorporated by reference.

BACKGROUND OF THE INVENTION

The present invention generally relates to power system protection, and more specifically, to an apparatus and method for compensating secondary currents used in differential protection to correct for a phase shift introduced between high voltage and low voltage transformer windings.

Electric utility systems or power systems are designed to generate, transmit and distribute electrical energy to loads. In order to accomplish this, power systems generally include a variety of power system elements such as electrical generators, electrical motors, power transformers, power transmission lines, buses and capacitors, to name a few. As a result, power systems must also include protective devices and procedures to protect the power system elements from abnormal conditions such as electrical short circuits, overloads, frequency excursions, voltage fluctuations, and the like.

Protective devices and procedures act to isolate some power system element(s) from the remainder of the power system upon detection of the abnormal condition or a fault in, or related to, the power system element(s). Logically grouped zones of protection, or protection zones utilizing the protective devices and procedures, are established to efficiently manage faults or other abnormal conditions occurring in the power system elements.

In general, protection zones may be classified into six categories based on the type of power system elements to be protected. The categories include: (1) generators and generator-transformer elements (2) transformers, (3) buses, (4) lines (transmission, sub-transmission and distribution), (5) utilization equipment (motors, static loads), and (6) capacitor or reactor banks. As a result, a variety of protective devices are required. Such protective devices may include different types of protective relays, surge protectors, arc gaps and associated circuit breakers and reclosures.

Although the fundaments of power system protection are similar, each of the six categories of protection zones use protective devices that are based on the characteristics of the power system elements in that category. More specifically, a variety of types of protective relays utilizing a number of protective schemes (e.g., differential current comparisons, magnitude comparisons, frequency sensing), are required to protect the various power system elements. For example, a current differential relay, having nn electrical connections, is designed to monitor current flowing into a power system element (e.g., a power transformer) by measuring the current flowing into the power system element and calculating inter alia, the sum of all measured current, or the operate current. As is known, when operating under normal conditions, the sum of all of the (primary) currents entering the power system element is about zero (Kirchhoff's current law). If the power system element has a short circuit, or is faulted, its operate current will be substantially different from zero, indicating that there is some impermissible path through which a current is flowing. If the operate current exceeds some threshold, or pickup current, the current differential relay issues a tripping signal to an associated power circuit breaker(s), causing it to open and isolate the faulted power system element from the remainder of the power system.

Because currents resulting from a fault can easily exceed 10,000 amperes (amps) and because a protective device, such as the current differential relay described above, is designed to measure currents up to 100 amps via its nn electrical connections, the protective device is coupled to the power system element(s) via a number of current transformers. The current transformers operate to proportionally step-down the power system current (while retaining the same phase relation) flowing into the protected power system element, to a magnitude that can be readily monitored and measured by the protective device. As is known, the three-phase current flowing into the protected element is commonly referred to as a primary current, and the current flowing from the current transformers to the protective device is commonly referred to as a secondary current. The resulting lower secondary currents are used by the protective device to determine corresponding phasors representative of the primary current. The phasors are then used in the various overcurrent, directional, distance, differential, and frequency protective logic schemes of the various protective devices.

Because of potential relay mis-operation, current differential relays are typically designed with a restraint mechanism intended to restrain the current differential relay under certain circumstances (e.g., prevent it from issuing an erroneous trip signal). One restraint mechanism includes increasing the pickup current of the current differential relay as the currents entering the protected element increase. For example, Equation (1) illustrates one example of calculating the operate current for a current differential relay that utilizes a restraint mechanism.

$$I_{operate} > I_{pickup} + k \cdot I_{restraint} \quad (1)$$

where $I_{operate} = |\bar{I}_1 + \bar{I}_2 + \bar{I}_3 + \ldots \bar{I}_n|$, and $I_{restraint} = |\bar{I}_1| + |\bar{I}_2| + |\bar{I}_3| + \ldots |\bar{I}_n|$, and k=constant. Using one differential scheme, when the operate current $I_{operate}$ exceeds the sum of the pickup threshold current $I_{pickup}$ plus the product of some constant and the sum of the magnitudes of all the currents $k \cdot I_{restraint}$ entering the protected element, a fault is declared for the protected power system element and the current differential relay issues a tripping signal. The equations described above may be easily modified to accommodate a typical three-phase power system. For example, $I_{A\_operate}$ is the operate current of an A-phase differential element of the current differential relay and $I_{A1}$ represents the secondary current from the A-phase current transformer, $I_{B\_operate}$ is the operate current of a B-phase differential element of the current differential relay and $I_{B1}$ represents the secondary current from the B-phase current transformer, and $I_{C\_operate}$ is the operate current of a C-phase differential element of the current differential relay and $I_{C1}$ represents the secondary current from the C-phase current transformer. Alternate differential schemes may also be used when comparing the operate and restraint currents.

Current differential relays are commonly used to protect power transformers having a first high voltage (HV) winding and a second low voltage (LV) winding. For ease of discussion, such current differential relays are referred to herein as power transformer differential relays that are configured to monitor the three-phase current on both the HV busbar side and the LV busbar side of the power transformer, via secondary currents provided by respective current transformer groups.

As is known, the HV and the LV windings of a power transformer may be arranged using one of a number arrangements (or combinations of the arrangements) such as a wye-wye configuration, a delta-delta configuration, a wye-delta configuration and a delta-wye configuration, to name a few. For like-windings arrangements such as the wye-wye arrangement, there is normally no angular displacement, or phase shift, between the HV and LV windings. For all other winding arrangements, there is an angular displacement of 30 degrees (or multiples thereof) between the currents of the HV and LV windings.

Prior to becoming operation in the power system, the power transformer and its associated power transformer differential relay are tested under no-load conditions, or "commissioned". Such commissioning involves many factors, and generally includes checking for errors associated with current transformer (CT) installation. For example, commissioning using traditional electromechanical relays required labor intensive manual intervention by a commissioning engineer to check for errors such as improper current transformer installation which may result in incorrect CT polarities. Other manual tests required during commissioning included ensuring that the current transformer group, or the three individual CTs, at a particular voltage level (e.g., the HV busbar) have the same current transformer ratios, or the same CT tapping.

Various systems and methods have been proposed to minimize manual intervention during relay commissioning. For example, U.S. Pat. No. 5,276,402, entitled "Three-phase Transformer Testing Method and System", issued Jan. 4, 1994 to inventor Schucht, proposed a three-phase transformer testing method and system that enabled automatic measurement of core loss, load loss and transformer ratio, and performance of polarity checks and phase-relationships. In another example, U.S. Pat. No. 4,758,774, entitled "Portable Tester and Related Method for Determining the Primary Winding to Secondary Winding Current Ratio of an In-service Current Transformer", issued Jul. 19, 1988 to inventors Crawford et al, described a portable tester for determining the primary winding to secondary winding current ratio of a current transformer while the transformer is coupled to the power system.

While requiring some manual intervention, the microprocessor-based, or numerical, relays can be programmed to assist the commissioning engineer in the commissioning process. Accordingly, a numerical power transformer differential relay can be programmed to automatically determine (1) whether an incorrect CT polarity is present, (2) whether one or more crossed phases is present (e.g., improper current transformer wiring causing phase-B secondary current to be received by the protective relay as phase-C current element, and vice versa) and (3) whether an incorrect CT ratio exists (e.g., an incorrect TAP connection of the A-phase transformer). For example, Young and Horak, in their paper entitled "Commissioning Numerical Relays", described a system that tests for CT wiring errors such as incorrect CT polarities, incorrect CT ratios and cross-phased wiring errors. Unfortunately, none of the prior art systems and methods for commissioning provided a way to automatically compensate secondary currents used by current differential protection schemes to correct for a phase shift occurring between the currents of the HV winding and the LV winding of a power transformer. When not corrected, such a phase shift between the currents of the HV winding and the LV winding may result in power transformer differential relay mis-operation.

SUMMARY OF THE INVENTION

In accordance with the invention, disclosed is an apparatus and method to select and provide to a differential relay, an operational vector-group compensation setting pair that automatically corrects a phase shift occurring between the currents of the HV and LV windings of a power transformer during power transformer operation. The operational vector-group compensation setting pair is selected during a commissioning process to adjust, or compensate for, a phase shift between the primary currents of the HV and LV windings. Because such a phase shift is reflected in like-phase secondary currents, the operational vector-group compensation setting pair is applied to the secondary currents used by the differential relay to perform power transformer protection. When applied, the operational vector-group compensation setting pair also automatically removes zero-sequence current from the secondary currents used by the differential relay to perform power transformer protection.

In general, on condition that a pre-determined amount of current flows through the power transformer to ensure proper CT operation, the method includes performing a compensation matrix selection process to select a 3-by-3 compensation matrix pair representing a vector-group compensation setting pair, performing a phase angle verification process, and confirming selection of and installing the vector-group compensation setting pair as the operational vector-group compensation setting pair in the differential relay.

In accordance with an aspect of the invention, an apparatus is provided for selecting and providing to a differential relay an operational vector-group compensation setting pair that automatically provides correction for a phase shift occurring between currents of at least two windings of a power transformer of a three-phase power system. The apparatus includes a means for deriving a first and a second plurality of digitized current sample streams from corresponding secondary currents provided by a first current transformer group connecting the differential relay to a first winding of the at least two windings and a second transformer group connecting the differential relay to a second winding of the at least two windings, respectively. The apparatus also includes a microcontroller operatively coupled to the means for deriving the first and the second plurality of digitized current sample streams where the microcontroller has a microprocessor and a memory operatively coupled to the microprocessor. The microprocessor is configured to calculate a corresponding first and a corresponding second plurality of phasors using the first and the second plurality of digitized current sample streams, to provide a plurality of 3-by-3 compensation matrices where the plurality of 3-by-3 compensation matrices represent a corresponding plurality of vector-group compensation settings, and after establishing a baseline compensation matrix pair configuration, to iteratively calculate a number of sets of three-phase operate current values using a corresponding plurality of different pair combinations of the plurality of 3-by-3 compensation matrices applied to the first and the second plurality of phasors. Based on a comparison of each of the plurality of sets of three-phase operate current values to a per-unit threshold value, one of the plurality of different pair combinations of the plurality of 3-by-3 compensation matrices is selected as the operational vector-group compensation setting pair, where application of a first vector-group compensation setting of the operational vector-group compensation setting pair to the first plurality of phasors and application of a second vector-group compensation setting of the operational vector-group compensation setting pair to the second plurality of phasors automatically provides correction for the phase shift occurring between currents of the first winding and the second winding.

In accordance with another aspect of the invention, provided is a method for selecting and providing to a microcontroller of a power transformer differential relay an operational vector-group compensation setting pair that automatically provides correction for a phase shift occurring between currents of at least two windings of a power transformer of a three-phase power system. The method includes receiving a first and a second plurality of digitized current sample streams derived from corresponding secondary currents provided by a first current transformer group connecting the differential relay to a first winding of the at least two windings and a second transformer group connecting the power transformer differential relay to a second winding of the at least two windings, respectively, and using the first and the second plurality of digitized current sample streams, calculating a corresponding first and a corresponding second plurality of phasors. The method further includes providing a plurality of 3-by-3 compensation matrices where the plurality of 3-by-3 compensation matrices represent a corresponding plurality of vector-group compensation settings, and after establishing a baseline compensation matrix pair configuration, iteratively calculating a number of sets of three-phase operate current values using a corresponding plurality of different pair combinations of the plurality of 3-by-3 compensation matrices applied to the first and the second plurality of phasors. Based on a comparison of each of the plurality of sets of three-phase operate current values to a per-unit threshold value, one of the plurality of different pair combinations of the plurality of 3-by-3 compensation matrices is selected as the operational vector-group compensation setting pair, where application of a first vector-group compensation setting of the operational vector-group compensation setting pair to the first plurality of phasors and application of a second vector-group compensation setting of the operational vector-group compensation setting pair to the second plurality of phasors automatically provides correction for the phase shift occurring between currents of the first winding and the second winding.

In accordance with yet another aspect of the invention, a method is provided for providing an operational vector-group compensation setting pair to a power transformer differential relay where the operational vector-group compensation setting pair automatically provides correction for a phase shift occurring between currents of a first winding and a second winding of a power transformer of a three-phase power system. The method includes, based on a first and a second plurality of digitized current sample streams derived from a plurality of secondary currents corresponding to currents of the first winding and the second winding respectively, calculating a corresponding first and a corresponding second plurality of phasors. The method further includes selecting a pair of vector-group compensation settings based on three-phase operate current values calculated using the first and second plurality of phasors, and applying a first vector-group compensation setting of the selected vector-group compensation setting pair to the first plurality of phasors to form a first set of three test phasors and applying a second vector-group compensation setting of the selected vector-group compensation setting pair to the second plurality of phasors to form a second set of three test phasors. The method further includes after adjusting each of the three test phasors of the first set by one-hundred and eighty degrees to form an adjusted first set of three test phasors and if phase angles of each of the adjusted first set of three test phasors is within a pre-determined angle range of phase angles of each of the like-phase phasors of the second set of three test phasors, enabling application of the vector-group compensation setting pair as the operational vector-group compensation pair.

It should be understood that the present invention includes a number of different aspects or features which may have utility alone and/or in combination with other aspects or features. Accordingly, this summary is not exhaustive identification of each such aspect or feature that is now or may hereafter be claimed, but represents an overview of certain aspects of the present invention to assist in understanding the more detailed description that follows. The scope of the invention is not limited to the specific embodiments described below, but is set forth in the claims now or hereafter filed.

BRIEF DESCRIPTION OF THE DRAWINGS

FIG. 8 is an exemplary commissioning report resulting from execution of the commissioning process of FIG. 4.

DETAILED DESCRIPTION OF THE INVENTION

In addition to selecting and providing to a power transformer differential relay, an operational vector-group compensation setting pair that automatically compensates secondary currents to correct a phase shift between the primary currents of the HV and LV windings, implementation of the apparatus and methods disclosed herein also provides a commissioning report to a commissioning engineer. Among other things, the commissioning report includes commissioning information such as phase rotation (e.g., angular displacement between the windings), the measured load current during the commissioning process, and the recommended vector group setting resulting from these measurements. Subsequent application of the operational vector-group compensation setting pair also automatically removes zero-sequence current from the secondary currents used by the power transformer differential relay during power system operation.

For ease of discussion, aspects of the present invention can be more fully understood by limiting the detailed discussion to power transformers having un-like winding arrangements such as a wye-delta arrangement, that have inherent nominal 30 degree phase shifts. Further, although described below in terms of a power transformer and a power transformer differential relay, it should be understood that the apparatus and method disclosed herein is also applicable to any differential current protection applications that include at least one group of delta connected current transformers such as, for example, current differential busbar protection.

Figure 1:
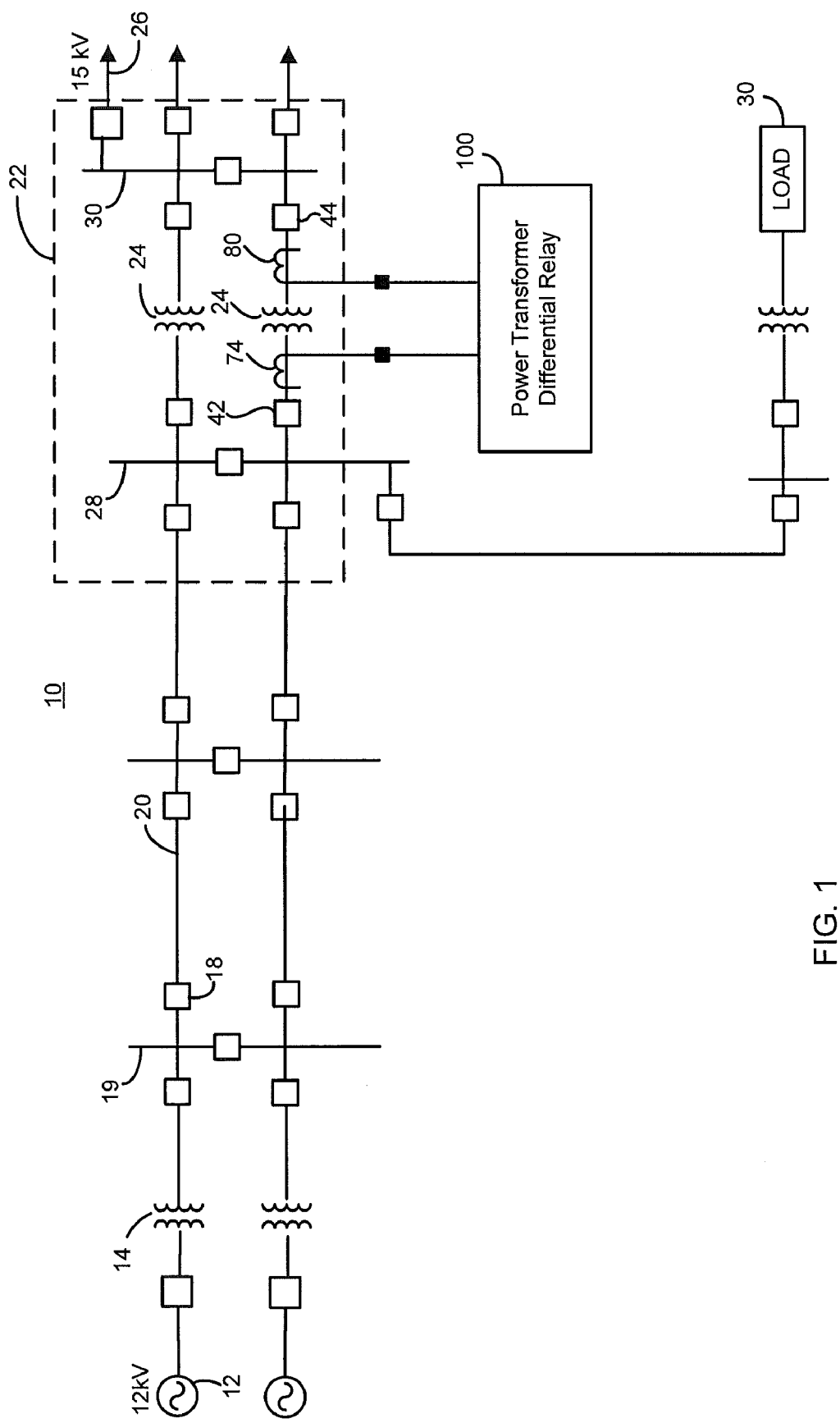
FIG. 1 is a single line schematic diagram of a power system that may be utilized in a typical metropolitan area.

FIG. 1 is a single line schematic diagram of a power system 10 that may be utilized in a typical metropolitan area. As illustrated in FIG. 1, the power system 10 includes, among other things, two generators 12 configured to generate three-phase sinusoidal waveforms, for example, three-phase 12 kV sinusoidal waveforms, two step-up power transformers 14 configured to increase the 12 kV sinusoidal waveforms to a higher voltage such as 345 kV and a number of circuit breakers 18. The step-up power transformers 14 provide the higher voltage sinusoidal waveforms to a number of long distance transmission lines 20 and a bus bar 19. The bus bar 19 operates to distribute the higher voltage sinusoidal waveforms to other portions of the power system 10. A number of circuit breakers 18 are also included to disconnect an associated faulted portion of the power system 10 in response to a trip signal from a protective element (e.g., a protective relay) monitoring that faulted portion. At the end of the long distance transmission lines 20, a substation 22 includes a number of step-down power transformers 24 to transform the higher voltage sinusoidal waveforms (e.g., 345 kV) to lower voltage sinusoidal waveforms (e.g., 15 kV) suitable for distribution via a distribution line 26 to various end users and loads 30.

As previously mentioned, the power system 10 includes many protective devices where each protective device is configured to monitor an individual power system element or zone for faults, and to issue a trip signal to an associated circuit breaker when a fault is detected. The protective devices utilize a variety of protective logic schemes to determine whether a fault or other problem exists in the power system 10. For example, a power transformer differential relay utilizes a current differential comparison to determine whether a fault exists in an associated power transformer.

Referring again to FIG. 1, a power transformer differential relay 100 is provided to detect faults or other abnormal conditions in or near the power transformer 24 between current transformer groups 74 and 80. The power transformer differential relay 100 is connected via first and second current transformer groups 74 and 80 across the power transformer 24 between HV busbars 28 and LV busbars 30. During operation, the operate currents $I_{operate}$ and the restraint currents $I_{restraint}$ associated with three-phases of an HV winding and an LV winding of the power transformer currents are calculated using the scaled, secondary currents provided by corresponding first and second current transformer groups, 74 and 80, respectively.

Figure 2:
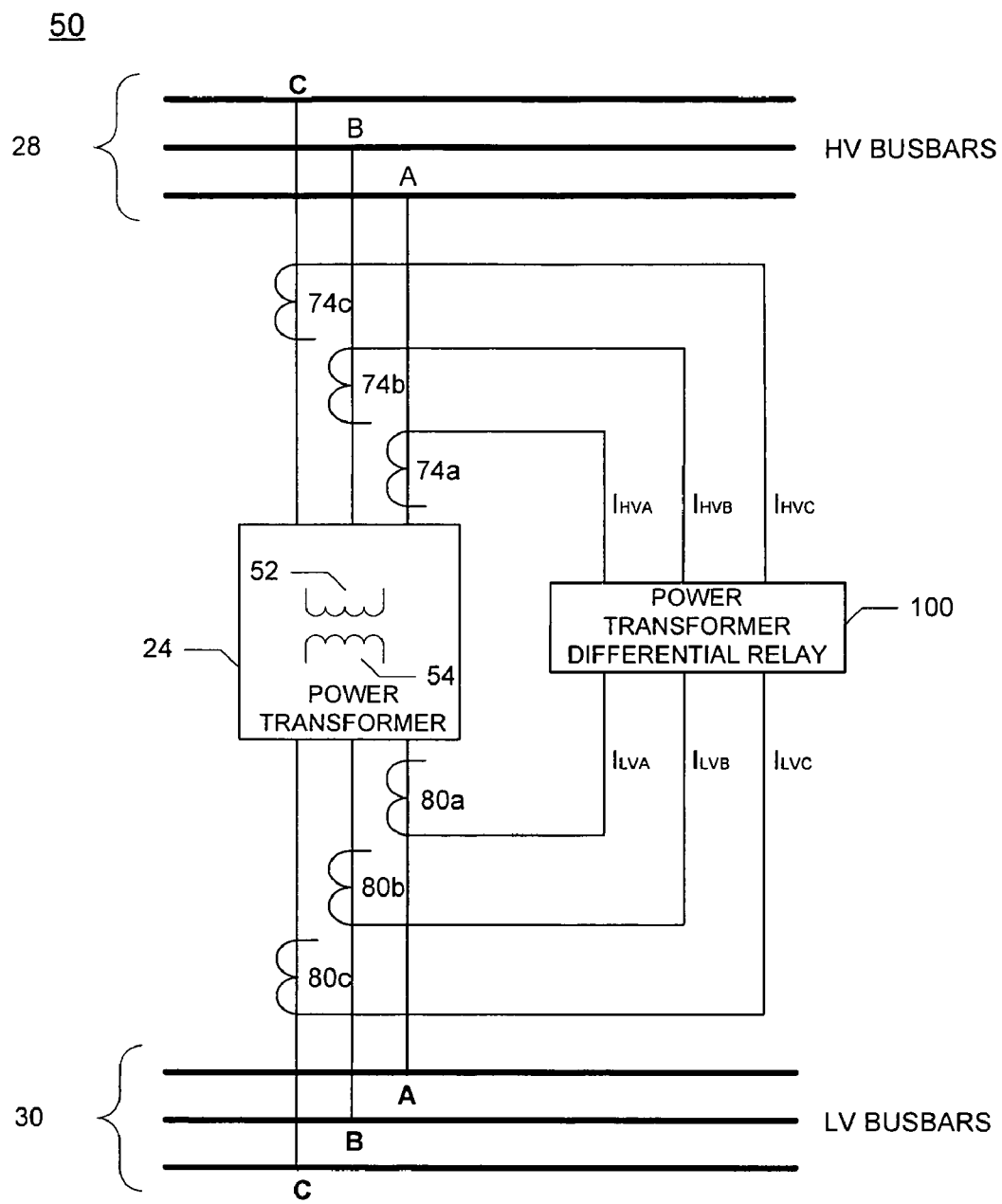
FIG. 2 is a three-phase schematic diagram illustrating the power transformer differential relay connected to the power transformer of FIG. 1, according to an embodiment of the invention.

For example, FIG. 2 is a three-phase schematic diagram illustrating the power transformer differential relay 100 connected to the power transformer 24 via the first and second current transformer groups 74, 80, according to an embodiment of the invention. When installed and operational, the power transformer differential relay 100 monitors the individual A-phase, the B-phase and the C-phase secondary currents provided by the first and second current transformer groups 74, 80 on respective sides (HV and LV) of the power transformer. The power transformer differential relay 100 also continuously calculates the individual operate and restraint currents of three differential elements, and compares the calculated operate and restraint currents as described above to determine whether a fault exists in the zone between the first and second group of current transformers 74, 80 where the zone includes the power transformer 24.

During operation, the power transformer differential relay 100 protects the A-phase windings of the power transformer 24 by continuously calculating the A-phase differential element operate current $I_{A\_operate} = |\overline{I}_{HVA} + \overline{I}_{LVA}|$ and the A-phase differential element restraint current $I_{A\_restraint} = |\overline{I}_{HVA}| + |\overline{I}_{LVA}|$ using secondary currents received via current transformers 74a and 80a. Similarly, the power transformer differential relay 100 protects the B-phase windings of the power transformer 24 by calculating the B-phase differential element operate current $I_{B\_operate} = |\overline{I}_{HVB} + \overline{I}_{LVB}|$ and the B-phase differential element restraint current $I_{B\_restraint} = |\overline{I}_{HVB}| + |\overline{I}_{LVB}|$ using secondary currents received via current transformers 74b and 80b, and protects the C-phase windings via calculating the C-phase differential element operate current $I_{C\_operate} = |\overline{I}_{HVC} + \overline{I}_{LVC}|$ and the C-phase differential element restraint current $I_{C\_restraint} = |\overline{I}_{HVC}| + |\overline{I}_{LVC}|$ using secondary currents received via the current transformers 74c and 80c.

Figure 3:
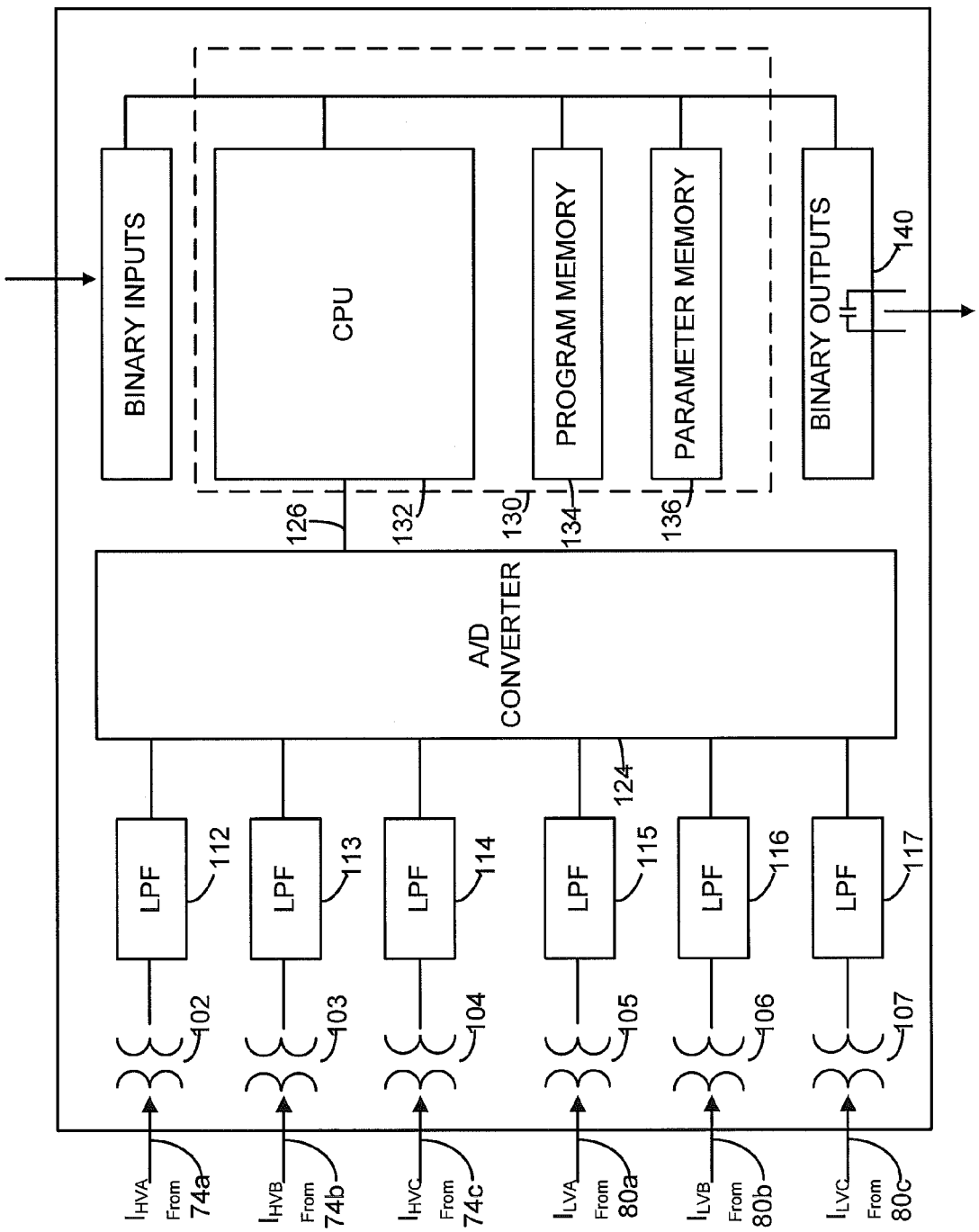
FIG. 3 is a block diagram of an exemplary configuration of the protective relay of FIG. 2.

When received by the power transformer differential relay 100, the secondary currents are processed to calculate corresponding magnitudes and phase angles used to determine whether a fault exists in the power transformer 24. FIG. 3 is a block diagram of an exemplary configuration Of the power transformer differential relay 100 of FIG. 2. During operation of the power transformer differential relay 100, the secondary current waveforms resulting from the current transformers 74a, 74b, 74c, 80a, 80b and 80c are further transformed into corresponding voltage waveforms via respective current transformers 102-107 and resistors (not separately illustrated), and filtered via respective analog low pass filters 112-117. An analog-to-digital (A/D) converter 124 then multiplexes, samples and digitizes the filtered secondary current waveforms to form corresponding digitized current sample streams 126 (e.g., 1011001010001111).

The corresponding digitized current sample streams 126 are received by a microcontroller 130, where they are digitally filtered via, for example, Cosine filters to eliminate DC and unwanted frequency components. In an embodiment, the microcontroller 130 includes a CPU, or a microprocessor 132, a program memory 134 (e.g., a Flash EPROM) and a parameter memory 136 (e.g., an EEPROM). As will be appreciated by those skilled in the art, other suitable microcontroller configurations (or FPGA configurations) may be utilized.

The microprocessor 132, executing a computer program, protection algorithm or relay logic scheme (discussed below), processes each of the digitized current sample streams 126 to extract phasors representative of their corresponding secondary waveforms, and then performs various calculations using the phasors to determine whether a fault (e.g., a short circuit) exists in the power transformer 24. If a fault is detected, the microprocessor 132 subsequently changes the state of the binary output contacts 140 to be closed thereby opening an associated power circuit breaker(s) (e.g., circuit breaker(s) 18) to isolate the power transformer 24 from the remainder of the power system 10.

Figure 4:
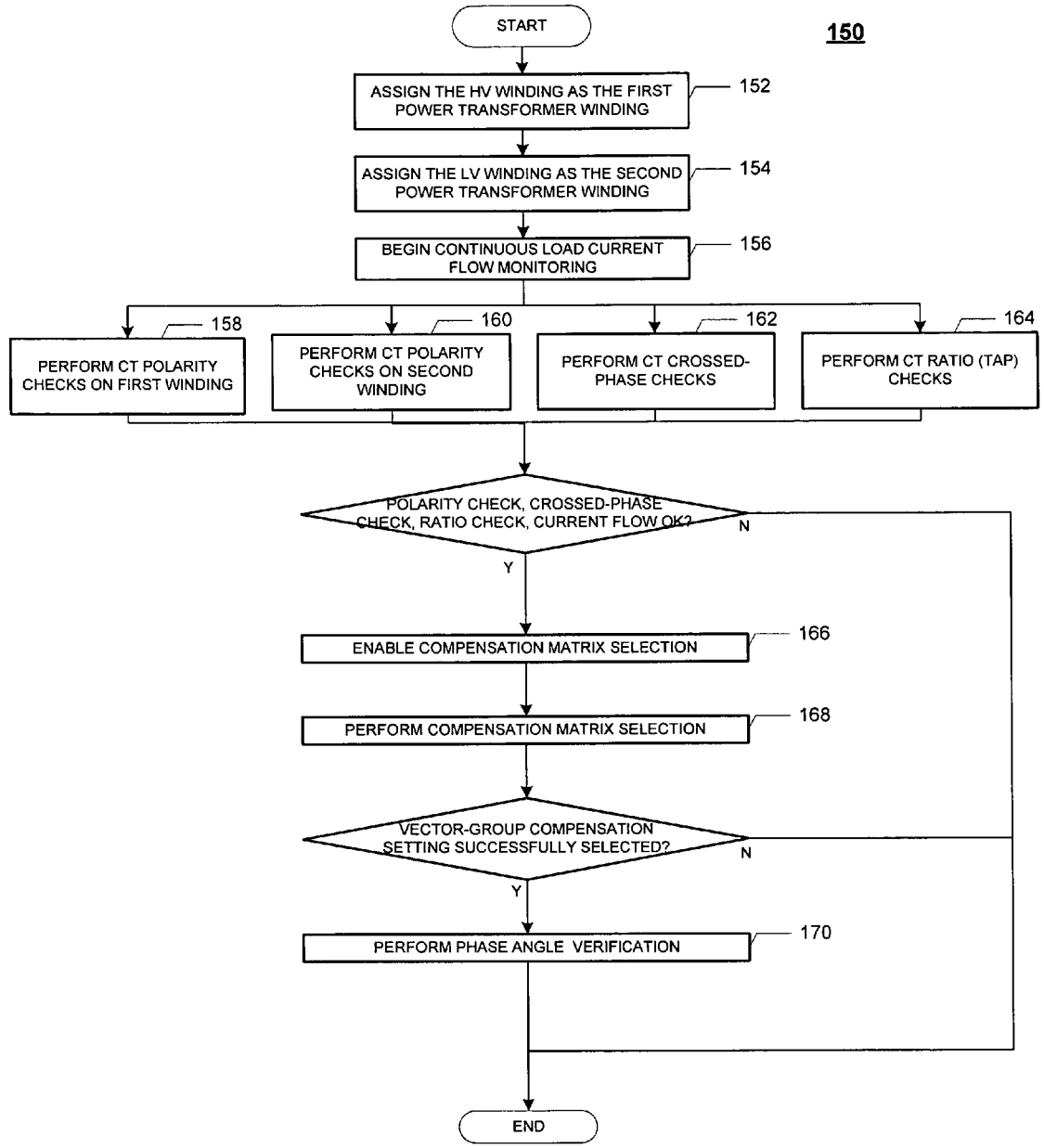
FIG. 4 an overview flowchart of a commissioning process for the power transformer differential relay and the power transformer of FIG. 1, according to an embodiment of the invention.

As is known, prior to becoming fully integrated into the power system 10, the power transformer differential relay 100 (and the power transformer 24) is commissioned to ensure proper subsequent operation. FIG. 4 is an overview flowchart of a commissioning process 150 for the power transformer differential relay 100 and the power transformer 24, according to an embodiment of the invention. Although executed by the microprocessor 132 of the power transformer differential relay 100, it is contemplated that the commissioning process 150 may be executed by an FPGA or the like, and/or may be executed in another type of computer-based device coupled to the power transformer differential relay 100. Further, although utilizing actual secondary load currents exceeding 250 milliamps (mA) provided by the current transformers, with the power transformer differential relay 100 and the power transformer 24 installed in power system 10, it is contemplated that the commissioning process 150 may be performed using secondary currents provided by other devices such as a portable three-phase generator connected to the power transformer 24. Moreover, although the power transformer differential relay 100 is utilized for ease of discussion, the commissioning process 150 may be performed using another type of differential relay.

Prior to beginning the commissioning process 150, the power transformer differential relay 100 is connected to the current transformer groups 74, 80. Preferably, particularly for new installations, the commissioning process of a power transformer differential relay with current transformers and an associated power transformer is performed over a period of days. Typically, the power transformer 24 is energized by closing a first circuit breaker 42 (see, FIG. 1) on the HV winding side of the power transformer while a second circuit breaker 44 (see, FIG. 1) on the LV winding side remains open. After a "soaking period" with only the first circuit breaker 42 closed for few days, the second circuit breaker 44 is closed, allowing secondary current to flow from the current transformer groups 74 and 80 to the power transformer differential relay 100. Under nominal conditions, such secondary current is sufficient to allow the commissioning process 150 to begin.

The commissioning process 150 begins when the microprocessor 132 assigns the HV winding 52 as a first, or a Reference, winding (step 152), and assigns the LV winding 54 as a second, or a Test, winding (step 154). It should be noted however that assignment of the HV and LV windings as first or second windings may vary, as long as the commissioning process 150 is executed using two corresponding power transformer windings. In the case of more than two windings, the reference winding may be selected to be two windings where the phase shift between the two windings has been corrected via selection of an operational vector-group compensation setting pair using the techniques described below. It should also be noted that assignment of the HV and LV windings may be made by the commissioning engineer rather than by the microprocessor 132.

In addition to assigning the HV winding 52 as the first winding and the LV winding 54 as the second winding, the microprocessor 132 begins monitoring the secondary currents from the CTs 74a, 74b, 74c, 80a, 80b, 80c to ensure a minimum, balanced current flow during the commissioning process 150. The current flow monitoring continues until completion of the commissioning process 150. In an embodiment, the minimum current is preferably 250 mA±5%, or five percent of the primary rated load current, however other minimum current values may be used as long as all current transformers operate in the linear portion of their respective B-H magnetization curves (magnetic flux density-magnetic field density curves) and unambiguous current measurements are used.

Next, the microprocessor 132 performs qualifying checks of current transformer installation. The qualifying checks include performing CT polarity checks on the HV winding 52 (step 158), performing CT polarity checks on the LV winding 54 (step 160), performing CT crossed-phase checks (step 162) and performing CT ratio checks (step 164). If the microprocessor 132 determines that (1) the CT polarity of the HV winding 52 and the LV winding 54 are correct, (2) there are no CT crossed-phases, (3) CT ratios are correct and (4) the minimum, balanced current flow has been maintained and continues to be maintained, a compensation matrix selection is enabled (step 166).

Figure 5:
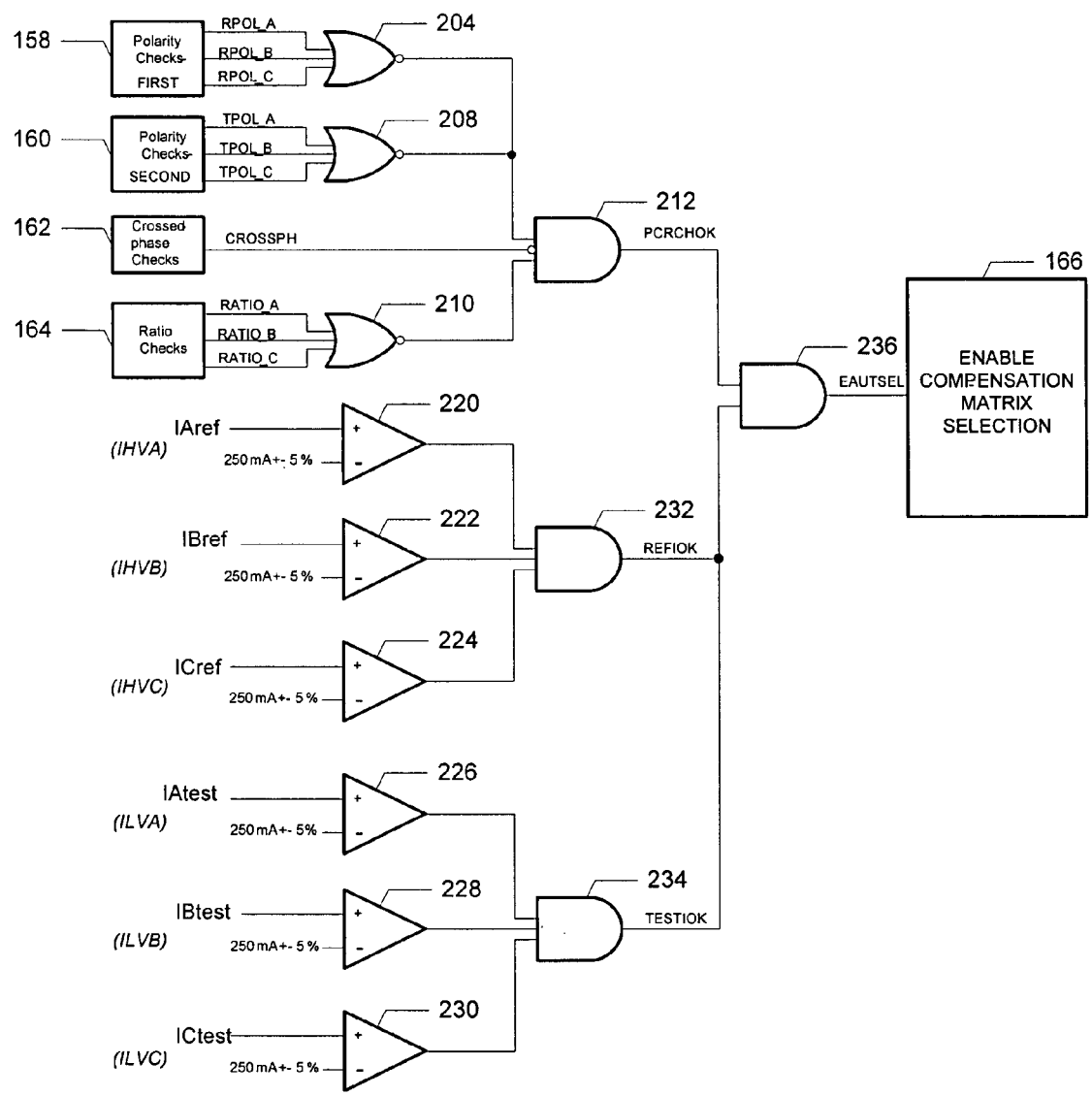
FIG. 5 is an exemplary enable compensation matrix selection logic diagram that may be used to enable compensation matrix selection, according to an embodiment of the invention.

For example, FIG. 5 is an exemplary enable compensation matrix selection logic diagram 200 that may be used to enable compensation matrix selection, according to an embodiment of the invention. As illustrated, the enable compensation matrix selection logic diagram 200 provides the logic for verification of correct polarity and CT ratios, no crossed-phases, and maintenance of balanced, current flow.

Assuming A-phase current of the first winding, or, the HV winding 52, as a reference phase current, Table 1 shows the angular relationship between the three phases when the polarities of the CTs of a current transformer group (e.g., the current transformer group 74a, 74b, 74c) are correct.

TABLE 1

| Correct Polarity Thumbprints | | |
|---|---|---|
| A-Phase | B-Phase | C-Phase |
| IA∠0° | IB∠−120° | IC∠120° |

Table 2 shows the three-phase angular relationships for incorrect polarity of each of the three phases. Because A-phase has been selected as the reference phase, the A-phase angle remains at 0 degrees.

TABLE 2

| Incorrect Polarity Thumbprints | | |
|---|---|---|
| A-Phase | B-Phase | C-Phase |
| *IA∠0° | IB∠60° | IC∠−60° |
| IA∠0° | *IB∠60° | IC∠120° |
| IA∠0° | IB∠−120° | *IC∠−60° |

*Incorrect polarity

Referring to FIG. 5, using the information in Table 1 and 2, the microprocessor 132 verifies that the CT polarity of the HV winding 52 and the LV winding 54 are correct for each of the three-phases (steps 158, 160, FIG. 4). If the CT polarity of the A-phase of the HV winding 52 is correct, an output $R_{POL\_A}$ has a first logic value such as a logic zero (i.e., a logic low voltage). If the CT polarity of the B-phase of the HV winding 52 is correct, an output $R_{POL\_B}$ has the first logic value, and if the CT polarity of the C-phase of the HV winding 52 is correct, an output $R_{PLO\_C}$ has the first logic value. As a result, an output of a first NOR-gate 204, configured to receive the outputs $R_{POL\_A}$, $R_{POL\_B}$ and $R_{POL\_C}$, has the second logic value, or a logic one (i.e., a logic high voltage). If one or more of the CT polarities of the HV winding 52 is incorrect, the output of the first OR-gate $R_{POL\_C}$ has the first logic value. Thus, when the HV winding A-phase CT has the incorrect polarity, $R_{POL\_A}$ asserts; when the HV winding B-phase CT has the incorrect polarity, $R_{POL\_B}$ asserts; when the HV winding C-phase CT has the incorrect polarity, $R_{POL\_C}$ asserts. Assertion by any one of the outputs $R_{POL\_A}$, $R_{POL\_B}$, and $R_{POL\_C}$ causes the output of the first NOR-gate 204 to de-assert (i.e., to yield the first logic value).

Similarly, if the CT polarity of the A-phase, the B-phase and the C-phase of the LV winding 54 is correct, an output $T_{POL\_BA}$ has the first logic value, an output $T_{POL\_B}$ has the first logic value and an output $T_{POL\_C}$ has the first logic value. As a result, an output of a second NOR-gate 208, configured to receive the outputs $T_{POL\_A}$, $T_{POL\_B}$ and $T_{POL\_C}$, has the second logic value. If one or more of the CT polarities of the LV winding 54 is incorrect, the output of the second NOR-gate 208 has the first logic value. Thus, when the LV winding A-phase CT has the incorrect polarity, $T_{POL\_A}$ asserts; when the LV winding B-phase CT has the incorrect polarity, $T_{POL\_B}$ asserts; and when the LV winding C-phase CT has the incorrect polarity, $T_{POL\_C}$ asserts. Assertion by any one of the outputs $T_{POL\_A}$, $T_{POL\_B}$, and $T_{POL\_C}$ causes the output of the second NOR-gate 208 to de-assert.

When performing the CT crossed-phase checks (step 162, FIG. 4), in order to detect crossed-phase wiring, the microprocessor 132 calculates the negative-sequence current as a percentage of the positive-sequence current, taking due cognizance of the phase rotation setting of the power transformer differential relay 100. If the phase rotation setting is ABC, and there is more than a previously defined amount of negative-sequence current (e.g., 10 percent of negative-sequence current), the microprocessor 132 declares a crossed-phase error. As a result an output CrossPh has the second logic value. Conversely, if there is less than the previously defined amount of negative-sequence current, indicating no crossed-phase errors, the output CrossPh has the first logic value. Thus, assertion of CrossPh occurs when either the negative-sequence current is greater than, for example, 10 percent of the positive-sequence current of the HV winding 52, or the negative sequence current is greater than, for example, 10 percent of the positive-sequence current of the LV Winding 54.

When verifying correct CT ratios (step 164, FIG. 4), the microprocessor 132 first checks for equal current magnitudes between corresponding phases on the same voltage level by calculating the zero-sequence current on the HV winding side (e.g., $\bar{I}_{HVA}+\bar{I}_{HVB}+\bar{I}HVBC=0$) and on the LV winding side (e.g., $\bar{I}_{LVA}+\bar{I}_{LVB}+\bar{I}_{LVBC}=0$) of the power transformer 24. If the zero-sequence current on the HV winding side is equal to the zero-sequence current on the LV winding side (e.g., both are zero), the microprocessor 132 concludes that the CT ratios are correct. In other words, if the zero-sequence current on the HV winding side is equal to the zero-sequence current on the LV winding side, each of the outputs Ratio_A, Ratio_B and Ratio_C has the first logic level and an output of a third NOR-gate 210, configured to receive the outputs Ratio_A, Ratio_B and Ratio_C, has the second logic value.

If however, the zero-sequence current on the HV winding side is not equal to the zero sequence on the LV winding side, the difference between the two zero-sequence currents is calculated to form a delta current. The delta current is compared to a predetermined range such as, for example, 25 mA±7%, by the microprocessor 132. If the delta current is in the range of 25 mA±7%, the microprocessor 132 concludes that the CT ratios are correct. If the delta current is outside the range of 25 mA±7%, the microprocessor 132 concludes that at least one of the CT ratios is incorrect and declares a CT ratio error. The microprocessor 132 then determines the phase (e.g., A-phase) with the incorrect CT ratio. Assertion of any one of the outputs Ratio_A, Ratio_B and Ratio_C causes the output of the third NOR-gate 210 to de-assert.

Thus, if the microprocessor 132 determines that (1) the CT polarity of the HV winding 52 and the LV winding 54 are correct, (2) there are no CT crossed-phases, and (3) CT ratios are correct, an output PCRCH$_{OK}$ of a first AND-gate 212 has the second logic value. If the microprocessor 132 determines that (1) either the CT polarity of the HV winding 52 and/or the LV winding 54 is incorrect, and/or (2) there is at least one CT crossed-phase, and/or (3) at least one CT ratio is incorrect, the output PCRCH$_{OK}$ has the first logic value, and the commissioning process 150 is not enabled until the CT problem is rectified.

As previously mentioned, the microprocessor 132 continuously monitors the secondary currents from the CTs 74a, 74b, 74c, 80a, 80b, 80c to ensure the minimum, balanced current flow during the commissioning process 150 (step 156, FIG. 4). Referring again to FIG. 5, three comparators, 220, 222, and 224 are each configured to compare one phase current of the three-phase secondary current (reflective of its corresponding primary phase current) of the HV winding 52, to a minimum current range of, for example 250 mA±5%. If the one phase current of the HV winding 52 is outside of the minimum current range of 250 ma±5%, an output of its corresponding comparator has the second logic value (e.g., the output of its corresponding comparator asserts). If one phase current of the HV winding 52 is inside the minimum current range of 250 mA±5%, an output of its corresponding comparator has the first logic value.

For example, the comparator 220 is configured to compare the A-phase secondary current of the HV winding 52 to the minimum current range of 250 mA±5%. If the A-phase secondary current of the HV winding 52 is outside the minimum current range of 250 mA±5%, an output of the comparator 220 has the second logic value. Thus, if each of the secondary currents of the HV winding 52 (corresponding to $I_{HVA}$, $I_{HVB}$ and $I_{HVC}$) is outside the minimum current range of 250 mA±5%, the outputs of corresponding comparators 220, 222 and 224 have the second logic value. Accordingly, an output REFI$_{OK}$ of a second AND-gate 232, configured to receive the outputs of the comparators 220, 222, 224, also has the second logic value.

Similarly, three comparators, 226, 228, and 230 are each configured to compare one phase current of the three-phase secondary current of the LV winding 54 to the minimum current 250 mA±5%. For example, comparator 226 is configured to compare the A-phase secondary current of the LV winding 54 to the minimum current 250 mA±5%. If the A-phase secondary current of the LV winding 54 is outside the minimum current range of 250 mA±5%, an output of the comparator 226 has the second logic value. Thus, if each of the secondary currents of the LV winding 54 (corresponding to $I_{LVA}$, $I_{LVB}$ and $I_{LVC}$) is outside of the minimum current range of 250 mA±5%, the outputs of corresponding comparators 226, 228 and 230 are the second logic value. Accordingly, an output TESTI$_{OK}$ of a third AND-gate 234, configured to receive the outputs of the comparators 226, 228, 230, also has the second logic value.

When each of the outputs of the first, second and third AND-gates 212, 232, 234 has the second logic value, an output EAUT$_{SEL}$ of a fourth AND-gate 236, configured to receive the outputs of the first, second and third AND-gates 212, 232, 234, has the second logic value. As a result, the microprocessor 132 causes the compensation matrix selection to be enabled (step 166, FIG. 4). Thus, if the microprocessor 132 determines that (1) the CT polarity of the HV winding 52 and the LV winding 54 are correct, (2) there are no CT crossed-phases, (3) CT ratios are correct, and (4) the minimum, balanced current flow has been maintained and continues to be maintained, the compensation matrix selection is enabled.

Figure 6:
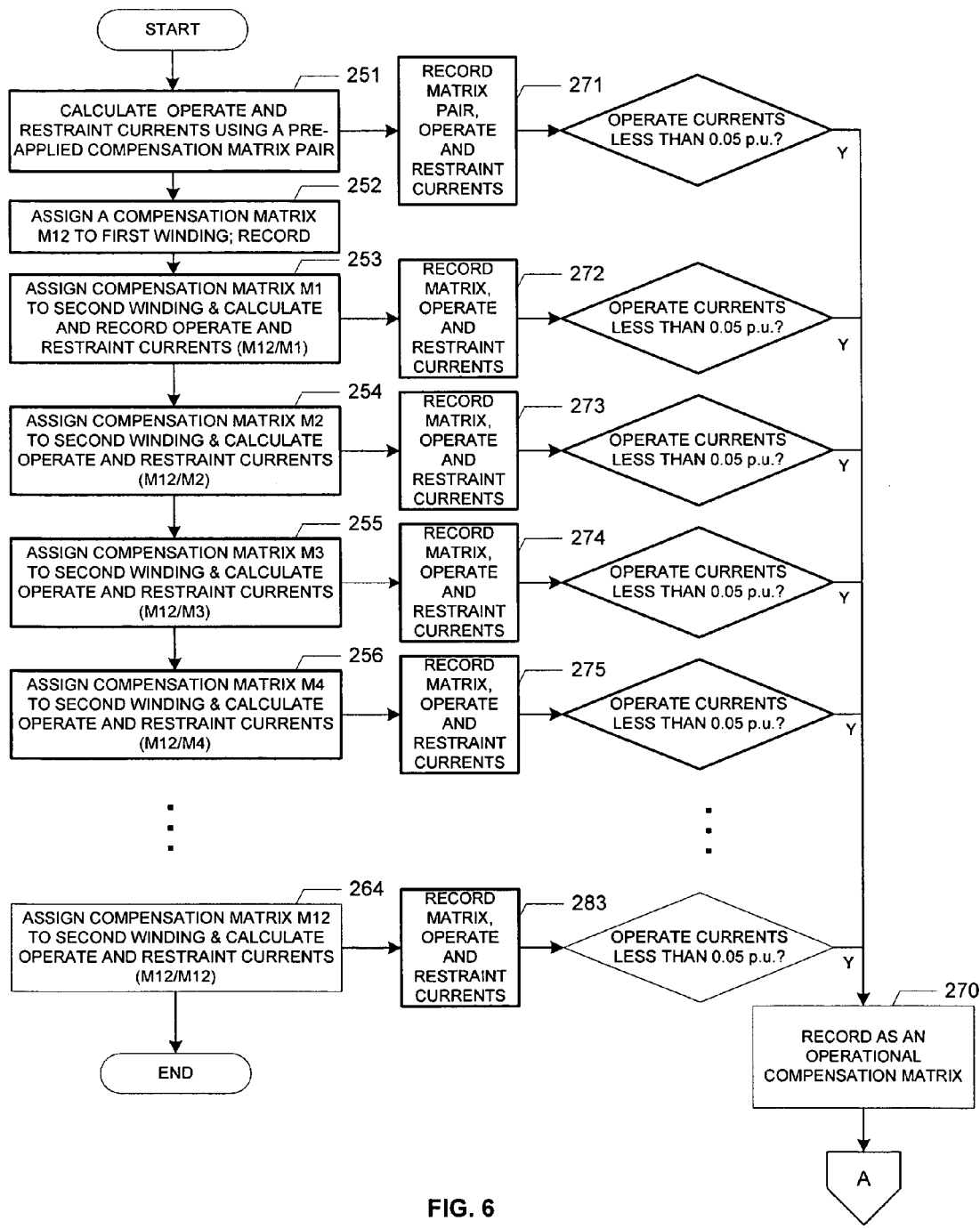
FIG. 6 is an exemplary logic flow diagram of a compensation matrix selection process that may be used to select an operational vector-group compensation setting pair during the commissioning process of FIG. 4.

Referring again to FIG. 4, after the compensation matrix selection is enabled (step 166), the microprocessor 132 performs the compensation matrix selection (step 168) to select from a number of vector-group compensation settings, an operation vector-group compensation setting pair that, when applied to calculations using the three-phase secondary current, automatically corrects a phase shift occurring between the currents of the HV and LV windings 52, 54 and further removes any zero-sequence current from the secondary currents. FIG. 6 is a logic flow diagram of a compensation matrix selection process 250 for selecting a vector-group compensation setting, according to an embodiment of the invention.

In general, during execution of the compensation matrix selection process 250, the microprocessor 132 assigns one of a number of 3-by-3 compensation matrices (e.g., 12 matrices), where each compensation matrix represents a vector-group compensation settings, to the HV winding 52, and then sequentially assigns, one-by-one, each of the number of compensation matrices to the LV winding 54. For each pair of compensation matrices, the microprocessor 132 calculates the operate current and restraint current values of each differential element (i.e., the A-phase differential element, the B-phase differential element and the C-phase differential element), and then records the sequentially assigned compensation matrix and the operate current and the restraint current values.

Upon comparing the value of the operate current values of each differential elements to a threshold current value (e.g., 0.05 per unit), the microprocessor 132 either rejects the compensation matrix pair or selects the compensation matrix pair as an acceptable operational vector-group compensation setting pair to compensate secondary currents associated with the HV and LV windings 52, 54. Applying the same compensation matrix each time to the HV winding 52 and applying a different compensation matrix to the LV winding 54, the process continues until each of the different compensation matrices has been assigned to the LV winding 54, and associated operate and restraint currents calculated. Thus, for 12 compensation matrices, after an operate and restraint current baseline is calculated, subsequent operate and restraint currents are calculated twelve times, each calculation using a different compensation matrix pair, and each result is compared to the threshold current value. Only one compensation matrix pair will yield operate current values below the threshold current value. Upon successful selection of the compensation matrix pair and after performing a successful phase angle verification process 300 (see, FIG. 7), the microprocessor 132 can either automatically apply the associated vector-group compensation setting pair to the three-phase currents of the LV winding 54 (i.e., enter the vector-group compensation setting pair into the power transformer differential relay 100), or the microprocessor 132 can apply it upon a confirmation by the commissioning technician.

The operational vector-group compensation setting pair is subsequently used to adjust the magnitudes of the associated current phasors calculated (using the secondary currents) by the microprocessor 132 to compensate for the phase shift between the HV and LV windings 52, 54, during power system operation. Although described in terms of A-, B- and C-phase differential elements, it should be understood that calculation of the operate and restraint current values is performed by the microprocessor 132 executing a computer program, protection algorithm or relay logic scheme.

For ease of discussion, each of the individual vector-group compensation settings may be referred to as 3-by-3 "compensation matrix" during the compensation matrix selection process 250 where each compensation matrix is defined and labeled as follows:

$$M1 := \frac{1}{\sqrt{3}} \cdot \begin{pmatrix} 1 & -1 & 0 \\ 0 & 1 & -1 \\ -1 & 0 & 1 \end{pmatrix}$$

-continued $$M2 := \frac{1}{3} \cdot \begin{pmatrix} 1 & -2 & 1 \\ 1 & 1 & -2 \\ -2 & 1 & 1 \end{pmatrix}$$

$$M3 := \frac{1}{\sqrt{3}} \cdot \begin{pmatrix} 0 & -1 & 1 \\ 1 & 0 & -1 \\ -1 & 1 & 0 \end{pmatrix}$$

$$M4 := \frac{1}{3} \cdot \begin{pmatrix} -1 & -1 & 2 \\ 2 & -1 & -1 \\ -1 & 2 & -1 \end{pmatrix}$$

$$M5 := \frac{1}{\sqrt{3}} \cdot \begin{pmatrix} -1 & 0 & 1 \\ 1 & -1 & 0 \\ 0 & 1 & -1 \end{pmatrix}$$

$$M6 := \frac{1}{3} \cdot \begin{pmatrix} -2 & 1 & 1 \\ 1 & -2 & 1 \\ 1 & 1 & -2 \end{pmatrix}$$

$$M7 := \frac{1}{\sqrt{3}} \cdot \begin{pmatrix} -1 & 1 & 0 \\ 0 & -1 & 1 \\ 1 & 0 & -1 \end{pmatrix}$$

$$M8 := \frac{1}{3} \cdot \begin{pmatrix} -1 & 2 & -1 \\ -1 & -1 & 2 \\ 2 & -1 & -1 \end{pmatrix}$$

$$M9 := \frac{1}{\sqrt{3}} \cdot \begin{pmatrix} 0 & 1 & -1 \\ -1 & 0 & 1 \\ 1 & -1 & 0 \end{pmatrix}$$

$$M10 := \frac{1}{3} \cdot \begin{pmatrix} 1 & 1 & -2 \\ -2 & 1 & 1 \\ 1 & -2 & 1 \end{pmatrix}$$

$$M11 := \frac{1}{\sqrt{3}} \cdot \begin{pmatrix} 1 & 0 & -1 \\ -1 & 1 & 0 \\ 0 & -1 & 1 \end{pmatrix}$$

$$M12 := \frac{1}{3} \cdot \begin{pmatrix} 2 & -1 & -1 \\ -1 & 2 & -1 \\ -1 & -1 & 2 \end{pmatrix}$$

The compensation matrix selection process 250 begins when the microprocessor 132 calculates and records the operate and restraint currents via applying a pair of default or other selected compensation matrices assigned to the HV winding 52 and the LV winding 54 prior to the start of the commissioning process 150 (step 251). The operate and restraint currents for each of the A-phase, the B-phase and the C-phase differential elements are calculated as follows:

A-phase element: $I_{operate\_A} = |\bar{I}_{HVA} + \bar{I}_{LVA}|$, $I_{restraint\_A} = |\bar{I}_{HVA}| + |\bar{I}_{LVA}|$ B-phase element: $I_{operate\_B} = |\bar{I}_{HVB} + \bar{I}_{LVB}|$, $I_{restraint\_B} = |\bar{I}_{HVB}| + |\bar{I}_{LVB}|$ C-phase element: $I_{operate\_C} = |\bar{I}_{HVC} + \bar{I}_{LVC}|$, $I_{restraint\_C} = |\bar{I}_{HVC}| + |\bar{I}_{LVC}|$ The microprocessor 132 then records the compensation matrices currently assigned to the HV and LV windings 52, 54, together with the calculated operate and restraint current values (step 271). In addition, if each of the three calculated operate current values is less than, for example, 0.05 per unit (p.u.), then the microprocessor 132 records the compensation matrices currently assigned to the HV and LV windings 52, 54 as a possible operational vector-group compensation setting pair for application to the power transformer differential relay 100. Calculated operate current values is less than a predetermined per unit value such as 0.05 p.u., indicates that, for each of the three phases, the magnitude and phase angle values of the compensated secondary current resulting from the HV winding side of the power transformer is within an associated predetermined percentage, such as 5%, of the magnitude value and phase angle of the like-phase, compensated secondary current resulting from the LV winding side of the power transformer 24. Accordingly, if the three operate current values are less than 0.05 p.u, application of the pair of previously assigned compensation matrices adjusted the magnitudes and phase angles of the associated current phasors calculated by the microprocessor 132 such that the phase shift between the currents of the HV and LV windings 52, 54 is corrected, and the magnitudes of the resulting HV and LV phasors are properly scaled. As noted above, even if each of the three calculated operate current values is greater than 0.05 per unit (p.u.), the microprocessor 132 records the compensation matrices currently assigned to the HV and LV windings 52, 54 together with the operate and restraint current values, but only for display in the report (discusses below in connection with FIG. 8) and not as possible operational setting for application to the power transformer differential relay 100.

Next, the microprocessor 132 assigns and records another compensation matrix, or reference matrix, to the HV winding 52, replacing the compensation matrix that was previously assigned to the HV winding (step 252). Although any compensation matrix may be assigned to the HV winding 52, in the instant example, the microprocessor 132 assigns the compensation matrix M12 as the reference compensation matrix. The microprocessor 132 also assigns another compensation matrix, or first test compensation matrix, to the LV winding 54, replacing the compensation matrix that was previously assigned to the LV winding 54. Although any compensation matrix may be assigned, in the instant example, the microprocessor 132 assigns the compensation matrix M1 as the first test compensation matrix.

After completing assignment of the reference compensation matrix and the first test compensation matrix, the microprocessor 132 records the first test compensation matrix and calculates and records the operate and restraint current values as described above (step 272), where calculation of the operate and restraint current values includes applying the compensation matrix M12 to the HV winding 52 and applying the compensation matrix M1 to the LV winding 54 (step 253). If each of the three resulting operate current values is less than 0.05 per unit (p.u.), the microprocessor 132 records the first test compensation matrix, or the compensation matrix M1, as an operational compensation matrix for later use as an operational vector-group compensation setting by the power transformer differential 100.

As mentioned above, while keeping the same reference compensation matrix assignment (e.g., the compensation matrix M12) for the HV winding 52, the microprocessor 132 sequentially assigns each of the compensation matrices M1-M12 to the LV winding 42 and records the sequentially assigned test compensation matrix and calculates and records corresponding operate and restraint current values. Accordingly, the microprocessor 132 assigns the compensation matrix M2, or the second test compensation matrix, to the LV winding 54, replacing the first test compensation matrix. Although assigned in numerical order, it is contemplated that the compensation matrices may be assigned to the LV winding 52 in any order, as long as each is applied to the LV winding 52 for operate and restraint current value calculations.

After assigning the second test compensation matrix, or the compensation matrix M2, to the LV winding 54, the microprocessor 132 records the second test compensation matrix and calculates and records the operate and restraint current values as described above (step 273), where calculation of the operate and restraint current values includes applying the compensation matrix M12 to the HV winding 52 and applying the compensation matrix M2 to the LV winding 54 (step 254). If each of the three calculated operate current values is less than 0.05 per unit (p.u.), then the microprocessor 132 records the second test compensation matrix, or the compensation matrix M2, as an operational compensation matrix for later use as an operational vector-group compensation setting by the power transformer differential 100.

As illustrated in remaining steps 255, 256 to 264, and corresponding steps 274, 275 to 283, the microprocessor 132 sequentially assigns and applies each of the remaining compensation matrices M3-M12 as the third, fourth, . . . twelfth test compensation matrix to the LV winding 54, one-by-one, and records the sequentially assigned test compensation matrix and calculates and records corresponding operate and restraint current values. As previously described, if one of the assignments yields operate current values of less than 0.05 p.u., the microprocessor 132 records the assigned test compensation matrix as an operational compensation matrix for later use as an operational vector-group compensation setting by the power transformer differential 100 (step 270). Only one compensation matrix pair (e.g., M12 and M3) will yield operate current values of less than 0.05 p.u when applied during operate and restraint current calculations.

Referring again to FIG. 4, after successful compensation matrix selection (step 168), the microprocessor 132 executes a phase angle verification process 300 (step 170) to verify that when the compensation matrix pair is applied, the phase angle of each of the three phases of the HV winding 52 is within a pre-determined angle range of the phase angle of each of the corresponding three phases of the LV winding 54.

Figure 7:
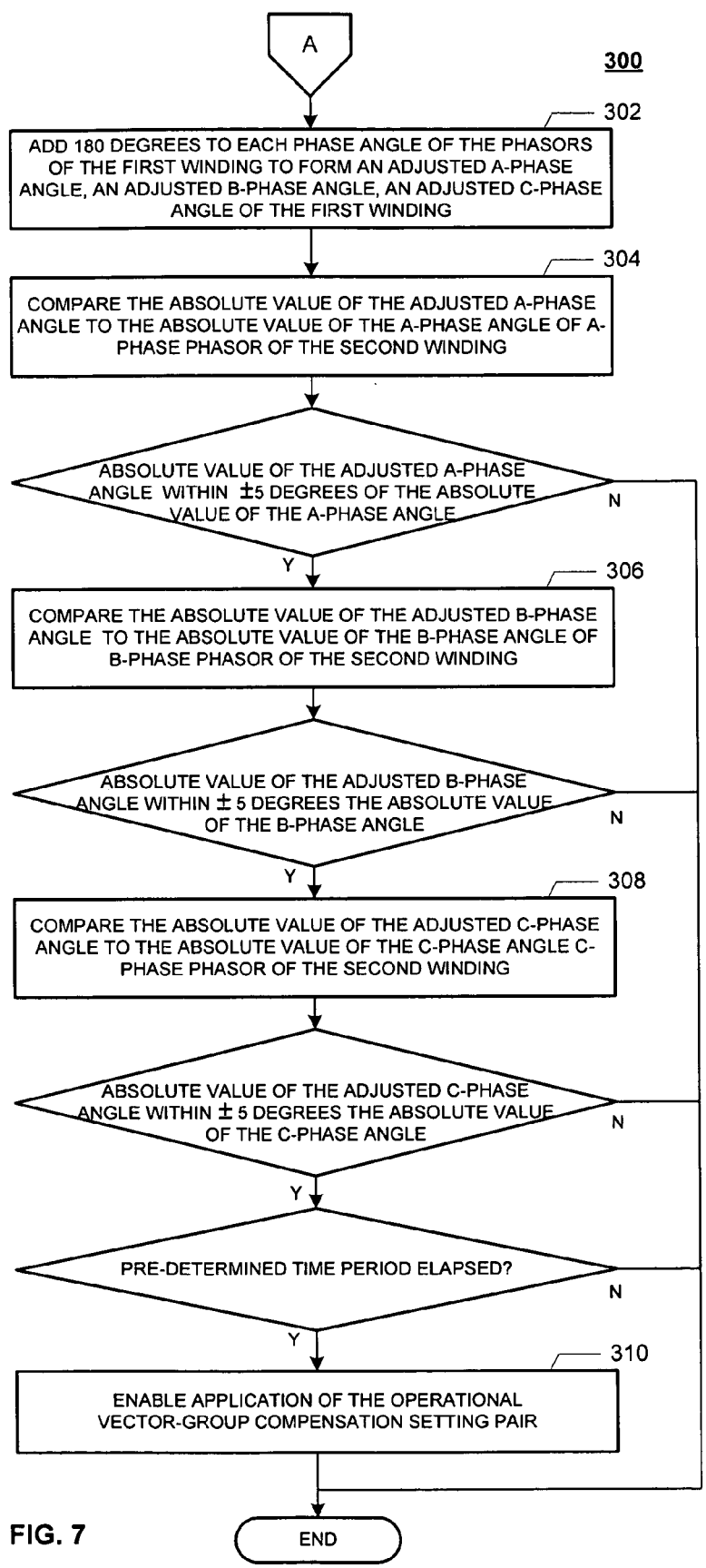
FIG. 7 is an exemplary flowchart of a phase verification process that may be used to verify the phase angles of secondary currents during the commissioning process of FIG. 4.

Referring to FIG. 7, the phase angle verification process 300 begins when the microprocessor 132 adjusts, by 180 degrees, the phase angle of the phasors derived from the secondary currents corresponding to each of the three phases of the HV winding 52 to form corresponding adjusted phase angles (step 302). Because the secondary currents from the current transformer group 74 are each 180 degrees out-of-phase with the secondary currents from the current transformer group 80 as a result of the polarity of customary CT connections associated with the power transformer differential relay 100, the phase angles are adjusted to align the phasors derived from the secondary currents prior to the phase angle comparisons. As a result of adding the 180 degree adjustment, an adjusted A-phase angle is 180 degrees greater than the A-phase angle of the HV winding 52, an adjusted B-phase angle is 180 degrees greater than the B-phase angle of the HV winding 52 and an adjusted C-phase angle is 180 degrees greater than the C-phase angle of the HV winding 52.

After forming the adjusted A-phase angle, the adjusted B-phase angle and the adjusted C-phase angle, the microprocessor 132 compares the absolute value of the adjusted A-phase angle of the HV winding 52 to the absolute value of the A-phase angle of the LV winding 54 (step 304). If the absolute value of the adjusted A-phase angle of the HV winding 52 is not within the pre-determined angle range (e.g., ±5 degrees) of the absolute value of the A-phase angle of the LV winding, indicating that the compensation matrix currently applied to the secondary currents associated with the LV winding 54 does not properly compensate the secondary currents associated with the HV winding 52, the microprocessor 132 terminates the phase angle verification process 300.

If, however, the absolute value of the adjusted A-phase angle of the HV winding 52 is within the pre-determined angle range (e.g., ±5 degrees) of the absolute value of the A-phase angle of the LV winding, indicating that the compensation matrix currently applied to the secondary currents associated with the LV winding 54 properly compensates the secondary currents associated with the HV winding 52, the microprocessor 132 compares the absolute value of the adjusted B-phase angle of the HV winding 52 to the absolute value of the B-phase angle of the LV winding 54 (step 306). If the absolute value of the adjusted B-phase angle of the HV winding 52 is not within the pre-determined angle range of the absolute value of the B-phase angle of the LV winding, the microprocessor 132 terminates the phase angle verification process 300.

If, however, absolute value of the adjusted B-phase angle of the HV winding 52 is within the pre-determined angle range of the absolute value of the B-phase angle of the LV winding, the microprocessor 132 compares the absolute value of the adjusted C-phase angle of the HV winding 52 to the absolute value of the C-phase angle of the LV winding 54 (step 308). If the absolute value of the adjusted C-phase angle of the HV winding 52 is not within the pre-determined angle range of the absolute value of the C-phase angle of the LV winding, the microprocessor 132 terminates the phase angle verification process 300.

If, however, absolute value of the adjusted C-phase angle of the HV winding 52 is within the pre-determined angle range of the absolute value of the C-phase angle of the LV winding 54, indicating that the compensation matrix currently applied to the secondary currents associated with the LV winding 54 properly compensates the secondary currents associated with the HV winding 52, the microprocessor 132 causes a timer (not separately illustrated) to begin a countdown.

After a pre-determined time period has elapsed, the microprocessor 132 enables (1) the vector-group compensation setting associated with the selected test compensation matrix to potentially become the operational vector-group compensation setting for the LV winding 54 and (2) the vector-group compensation setting associated with the reference compensation matrix (e.g., M12) to potentially become the operational vector-group compensation setting for the HV winding 52 (step 310). The microprocessor 132 may either automatically apply the vector-group compensation settings associated with the proper compensation matrices to the three-phase currents of the LV winding 54 and the HV winding 52, or the microprocessor 132 can apply them upon confirmation by the commissioning technician.

As previously mentioned, implementation of the apparatus and methods disclosed herein also provides a commissioning report to the commissioning engineer. For example, FIG. 8 is an exemplary commissioning report 350 resulting from execution of the commissioning process of FIG. 4. As illustrated, the commissioning report includes a settings status 352. The settings status 352 includes the (a) phase rotation (e.g., ABC), (b) the first winding, or HV winding 52, identification and compensation matrix assignment (e.g., compensation matrix M12), as well as (c) the second winding, or LV winding 54, identification and compensation matrix assignment (e.g., compensation matrix M3). Although provided via a timer, it is contemplated that the pre-determined time period may be provided using other suitable means.

The commissioning report also includes a before operate and restraint current status 354 that displays the "before" operate and restraints currents calculated by the microprocessor 132 using a pair of default or other compensation matrices assigned prior to the start of the commissioning process 150. Similarly, The commissioning report includes an after operate and restraint current status 356 that displays the "after" operate and restraints currents calculated by the microprocessor 132 using the sequentially selected compensation matrices during the commissioning process 150. Both of the before operate and restraint current status 354 and the after operate and restraint current status 356 may be used by the commissioning engineer to determine whether operational vector-group compensation settings pair, associated with the compensation matrix pair recorded during the compensation matrix selection process 250, provides better compensation than the vector-group compensation setting pair assigned prior to the start of the commissioning process 150.

As mentioned above, in some cases, the microprocessor 132 does not automatically "load" the operational vector-group compensation settings into the power transformer differential relay for use during power system operation. Rather, the commissioning engineer must make the determination as to whether to load the operational vector-group compensation settings into the power transformer differential relay. In those cases, the commissioning engineer may review the commissioning report prior to making such a decision.

Further, as illustrated, the commissioning report includes an operate and restraint current value table 358 that displays the operate and restraint current values calculated for each of the twelve pairs of compensation matrices.

As may be apparent from the above discussion, implementation of the apparatus and method disclosed herein selects and provides to a power transformer differential relay an operation vector-group compensation setting pair that automatically corrects a phase shift occurring between the currents of the HV and LV windings of a power transformer in the power transformer differential relay during operation of the power transformer.

While this invention has been described with reference to certain illustrative aspects, it will be understood that this description shall not be construed in a limiting sense. Rather, various changes and modifications can be made to the illustrative embodiments without departing from the true spirit, central characteristics and scope of the invention, including those combinations of features that are individually disclosed or claimed herein. Furthermore, it will be appreciated that any such changes and modifications will be recognized by those skilled in the art as an equivalent to one or more elements of the following claims, and shall be covered by such claims to the fullest extent permitted by law.

What is claimed is:

1. An apparatus for selecting and providing to a differential relay an operational vector-group compensation setting pair that automatically provides correction for a phase shift occurring between currents of at least two windings of a power transformer of a three-phase power system, the apparatus comprising:

a means for deriving a first and a second plurality of digitized current sample streams from corresponding secondary currents provided by a first current transformer group connecting the differential relay to a first winding of the at least two windings and a second transformer group connecting the differential relay to a second winding of the at least two windings respectively; and a microcontroller operatively coupled to the means for deriving the first and the second plurality of digitized current sample streams, the microcontroller having a microprocessor and a memory operatively coupled to the microprocessor, the microprocessor being configured to:

using the first and the second plurality of digitized current sample streams, calculate a corresponding first and a corresponding second plurality of phasors, provide a plurality of 3-by-3 compensation matrices, the plurality of 3-by-3 compensation matrices representing a corresponding plurality of vector-group compensation settings, after establishing a baseline compensation matrix pair configuration, iteratively calculating a number of test sets of three-phase operate current values and three-phase restraint current values using a corresponding plurality of different pair combinations of the plurality of 3-by-3 compensation matrices applied to the first and the second plurality of phasors, and based on a comparison of each of the three-phase operate current values of each of the number of test sets to a per-unit threshold value, select one of the plurality of different pair combinations of the plurality of 3-by-3 compensation matrices as the operational vector-group compensation setting pair, wherein application of a first vector-group compensation setting of the operational vector-group compensation setting pair to the first plurality of phasors and application of a second vector-group compensation setting of the operational vector-group compensation setting pair to the second plurality of phasors automatically provides correction for the phase shift occurring between currents of the first winding and the second winding.

2. The apparatus of claim 1, wherein prior to establishing the baseline compensation matrix pair configuration, the microprocessor is further configured to:

monitor a load current flow using magnitudes of the first and the second plurality of phasors; and perform a number of qualifying checks to verify proper installation of the first and second current transformer groups.

3. The apparatus of claim 2, wherein the qualifying checks include polarity checks on the first and the second current transformer groups, crossed-phase checks on the first and the second current transformer groups and ratio checks on the first and the second current transformer groups.

4. The apparatus of claim 2, wherein establishing the baseline compensation matrix pair configuration comprises:

calculating a baseline set of three-phase operate current values and three-phase restraint current values using a pair of previously assigned 3-by-3 compensation matrices of the plurality of 3-by-3 compensation matrices if proper installation of the first and the second transformer groups is verified and if the load current flow exceeds a minimum current value;

recording the pair of previously assigned 3-by-3 compensation matrices and the baseline set of three-phase operate current values and three-phase restraint current values; and comparing each of three-phase operate current values of the baseline set to a per-unit threshold value.

5. The apparatus of claim 4, wherein the minimum current value is 250 milliamps plus or minus 5%.

6. The apparatus of claim 4, wherein the per-unit threshold value is 0.05 per-unit.

7. The apparatus of claim 4, wherein iteratively calculating the number of test sets comprises:

(a) assigning and recording one of the plurality of 3-by-3 compensation matrices to the first winding, the one of the plurality of 3-by-3 compensation matrices comprising a reference compensation matrix;

(b) assigning another of the plurality of 3-by-3 compensation matrices to the second winding, the another of the plurality of 3-by-3 compensation matrices comprising a test compensation matrix;

(c) applying the reference compensation matrix and the test compensation matrix to the first and the second plurality of phasors respectively to calculate one of the number of test sets of three-phase operate current values and three-phase restraint current values;

(d) comparing each of the three-phase operate current values of the one of the number of test sets to the per-unit threshold value;

(e) if each of the three-phase operate current values of the one of the number of test sets is less than the per-unit threshold value, recording the test compensation matrix as an operation compensation matrix; and (f) iteratively repeating steps (b) through (e) until each of the plurality of 3-by-3 compensation matrices has been assigned to the second winding.

8. The apparatus of claim 7, wherein iteratively calculating the number of test sets further comprises recording the test compensation matrix and the one of the number of test sets of three-phase operate current values and three-phase restraint current values.

9. The apparatus of claim 7, wherein the microprocessor is further configured to:

enable application of a vector-group compensation setting pair corresponding to the reference compensation matrix and the operational compensation matrix as the operational vector-group compensation setting pair.

10. The apparatus of claim 7, wherein the microprocessor is further configured to:

(a) apply a vector-group compensation setting pair corresponding to the reference compensation matrix and the operational compensation matrix to the first and the second plurality of phasors, respectively, to calculate a corresponding first and a corresponding second set of three test phasors;

(b) adjust phase angles of the first set of three test phasors by one-hundred and eighty degrees to yield an adjusted first set of three test phasors;

(c) compare an absolute value of a phasor of the adjusted first set of three test phasors to an absolute value of a like-phase phasor of the second set of three test phasors to determine if a phase angle of the phasor of the adjusted first set of three test phasors is within a pre-determined angle range of a phase angle of the like-phase phasor of the second set of three test phasors;

(d) if the phase angle of the phasor of the adjusted first set of three test phasors is within the pre-determined angle range of the phase angle of the like-phase phasor of the second set of three test phasors, iteratively repeat steps (c) through (d) until each phasor of the adjusted first set of three test phasors has been compared to each like-phase phasor of the second set of three test phasors; and (e) if the phase angle of each of the adjusted first set of three test phasors is within the pre-determined angle range of the each of the like-phase phasors of the second set of three test phasors, enable application of the vector-group compensation setting pair corresponding to the reference compensation matrix and the operational compensation matrix as the operational vector-group compensation setting pair.

11. The apparatus of claim 10, wherein the pre-determined angle range is plus or minus 5 degrees.

12. The apparatus of claim 10, wherein application of the vector-group compensation setting pair corresponding to the reference compensation matrix and the operational compensation matrix is enabled as the operational vector-group setting pair after a pre-determined time period.

13. The apparatus of claim 7, wherein the microprocessor is further configured to:
enable application of a vector-group compensation setting pair corresponding to the pair of previously assigned 3-by-3 compensation matrices as the operational vector-group compensation setting pair if each of the three-phase operate current values of the baseline set is less than the per-unit threshold value.

14. The apparatus of claim 7, wherein the microprocessor is further configured to:
(a) apply a first vector-group compensation setting and a second vector-group setting of a vector-group compensation setting pair corresponding to the pair of previously assigned 3-by-3 compensation matrices to the first and the second plurality of phasors, respectively, to calculate a corresponding first and second set of three test phasors if each of the three-phase operate current values of the baseline set is less than the per-unit threshold value;
(b) adjust phase angles of the first set of three test phasors by one-hundred and eighty degrees to yield an adjusted first set of three test phasors;
(c) compare an absolute value of a phasor of the adjusted first set of three test phasors to an absolute value of a like-phase phasor of the second set of three test phasors to determine if a phase angle of the phasor of the adjusted first set of three test phasors is within a pre-determined angle range of a phase angle of the like-phase phasor of the second set of three test phasors;
(d) if the phase angle of the phasor of the adjusted first set of three test phasors is within the pre-determined angle range of the phase angle of the like-phase phasor of the second set of three test phasors, iteratively repeat steps (c) through (d) until each phasor of the adjusted first set of three test phasors has been compared to each like-phase phasor of the second set of three test phasors; and
(e) if the phase angle of each of the adjusted first set of three test phasors is within the pre-determined angle range of the each of the like-phase phasors of the second set of three test phasors, enable application of the vector-group compensation setting pair corresponding to the pair of previously assigned 3-by-3 compensation matrices as the operational vector-group compensation setting pair.

15. The apparatus of claim 14, wherein the pre-determined angle range is plus or minus 5 degrees.

16. The apparatus of claim 14, wherein application of the vector-group compensation setting associated with the pair of previously assigned 3-by-3 compensation matrices is enabled after a pre-determined time period.

17. The apparatus of claim 1, wherein the microprocessor is further configured to provide a commissioning report, the commissioning report including at least one of a settings status, a phase rotation setting of the first winding, a phase rotation status of the second winding and before and after operate and restraint current status.

18. The apparatus of claim 1, wherein the first winding comprises a high voltage winding of the power transformer, and wherein the second winding comprises a low voltage winding of the power transformer.

19. The apparatus of claim 1, wherein the means for deriving the first and the second plurality of digitized current samples comprises a plurality of low pass filters and an analog-to-digital converter.

20. The apparatus of claim 1, wherein the plurality of 3-by-3 compensation matrixes comprises twelve 3-by-3 compensation matrices representing twelve vector-group compensation settings.

21. The apparatus of claim 1, wherein the differential relay comprises a power transformer differential relay.

22. The apparatus of claim 1, wherein power transformer includes more than two windings, and wherein the microprocessor is further configured to:
apply the vector-group compensation setting pair to the first and second plurality of phasors and iteratively calculate another number of test sets of three-phase operate current values and three-phase restraint current values; and
based on a comparison of each of the three-phase operate current values of the another number of test sets to the per-unit threshold value, select one of the plurality of 3-by-3 compensation matrices as another operational vector-group setting, wherein application of the vector-group compensation setting pair to the first and second plurality of phasors and application of the another operational vector-group setting to a third plurality of phasors automatically provides correction for the phase shift occurring between the more than two windings.

23. A method for selecting and providing to a microcontroller of a differential relay an operational vector-group compensation setting pair that automatically provides correction for a phase shift occurring between currents of at least two windings of a power transformer of a three-phase power system, the method comprising:
receiving a first and a second plurality of digitized current sample streams derived from corresponding secondary currents provided by a first current transformer group connecting the differential relay to a first winding of the at least two windings and a second transformer group connecting the power transformer differential relay to a second winding at least two windings respectively;
using the first and the second plurality of digitized current sample streams to calculate a corresponding first and a corresponding second plurality of phasors;
providing a plurality of 3-by-3 compensation matrices, the plurality of 3-by-3 compensation matrices representing a corresponding plurality of vector-group compensation settings;
after establishing a baseline compensation matrix pair configuration, iteratively calculating a number of test sets of three-phase operate current values and three-phase restraint current values using a corresponding plurality of different pair combinations of the plurality of 3-by-3 compensation matrices applied to the first and the second plurality of phasors; and
based on a comparison of each of the three-phase operate current values of each of the number of test sets to a per-unit threshold value, select one of the plurality of different pair combinations of the plurality of 3-by-3 compensation matrices as the operational vector-group compensation setting pair, wherein application of a first vector-group compensation setting of the operational vector-group compensation setting pair to the first plurality of phasors and application of a second vector-group compensation setting of the operational vector-group compensation setting pair to the second plurality of phasors automatically provides correction for the phase shift occurring between currents of the first winding and the second winding.

24. The method of claim 23, wherein prior to establishing the baseline compensation matrix pair configuration, monitoring a load current flow using magnitudes of the first and the second plurality of phasors, and performing a number of qualifying checks to verify proper installation of the first and second current transformer groups.

25. The method of claim 24, wherein performing the number of the qualifying checks comprises:
   performing polarity checks on the first and the second current transformer groups;
   performing crossed-phase checks on the first and the second current transformer groups; and
   performing ratio checks on the first and the second current transformer groups.

26. The method of claim 24, wherein establishing the baseline compensation matrix pair configuration comprises:
   calculating a baseline set of three-phase operate current values and three-phase restraint current values using a pair of previously assigned 3-by-3 compensation matrices of the plurality of 3-by-3 compensation matrices if proper installation of the first and the second transformer groups is verified and if the load current flow exceeds a minimum current value;
   recording the pair of previously assigned 3-by-3 compensation matrices and the baseline set of three-phase operate current values and three-phase restraint current values; and
   comparing each of three-phase operate current values of the baseline set to a per-unit threshold value.

27. The method of claim 26, wherein the minimum current value is 250 milliamps plus or minus 5%.

28. The method of claim 26, wherein the per-unit threshold value is 0.05 per-unit.

29. The method of claim 26, wherein iteratively calculating the number of test sets comprises:
   (a) assigning and recording one of the plurality of 3-by-3 compensation matrices to the first winding, the one of the plurality of 3-by-3 compensation matrices comprising a reference compensation matrix;
   (b) assigning another of the plurality of 3-by-3 compensation matrices to the second winding, the another of the plurality of 3-by-3 compensation matrices comprising a test compensation matrix;
   (c) applying the reference compensation matrix and the test compensation matrix to the first and the second plurality of phasors respectively to calculate one of the number of test sets of three-phase operate current values and three-phase restraint current values;
   (d) comparing each of the three-phase operate current values of the one of the number of test sets to the per-unit threshold value;
   (e) if each of the three-phase operate current values of the one of the number of test sets is less than the per-unit threshold value, recording the test compensation matrix as an operational compensation matrix; and
   (f) iteratively repeating steps (b) through (e) until each of the plurality of 3-by-3 compensation matrices has been assigned to the second winding.

30. The method of claim 29, wherein iteratively calculating the number of test sets further comprises recording the test compensation matrix and the one of the number of test sets of three-phase operate current values and three-phase restraint current values.

31. The method of claim 30, further comprising enabling application of a vector-group compensation setting pair corresponding to the reference compensation matrix and the operational compensation matrix as the operational vector-group compensation setting pair.

32. The method of claim 30, further comprising:
   (a) applying the vector-group compensation setting pair corresponding to the reference compensation matrix and the operational compensation matrix to the first and the second plurality of phasors, respectively, to calculate a corresponding first and a corresponding second set of three test phasors;
   (b) adjusting phase angles of the first set of three test phasors by one-hundred and eighty degrees to yield an adjusted first set of three test phasors;
   (c) comparing an absolute value of a phasor of the adjusted first set of three test phasors to an absolute value of a like-phase phasor of the second set of three test phasors to determine if a phase angle of the phasor of the adjusted first set of three test phasors is within a pre-determined angle range of a phase angle of the like-phase phasor of the second set of three test phasors;
   (d) if the phase angle of the phasor of the adjusted first set of three test phasors is within the pre-determined angle range of the phase angle of the like-phase phasor of the second set of three test phasors, iteratively repeating steps (c) through (d) until each phasor of the adjusted first set of three test phasors has been compared to each like-phase phasor of the second set of three test phasors; and
   (e) if the phase angle of each of the adjusted first set of three test phasors is within the pre-determined angle range of the each of the like-phase phasors of the second set of three test phasors, enabling application of the vector-group compensation setting pair corresponding to the reference compensation matrix and the operational compensation matrix as the operational vector-group compensation setting pair.

33. The method of claim 32, further comprising enabling application of the vector-group compensation setting pair corresponding to the reference compensation matrix and the operational compensation matrix as the operational vector-group setting pair after a pre-determined time period.

34. The method of claim 32, wherein the pre-determined angle range is plus or minus 5 degrees.

35. The method of claim 30, further comprising:
   enabling application of a vector-group compensation setting pair corresponding to the pair of previously assigned 3-by-3 compensation matrices as the operational vector-group compensation setting pair if each of the three-phase operate current values of the baseline set is less than the per-unit threshold value.

36. The method of claim 30, further comprising:
   (a) applying a first vector-group compensation setting and a second vector-group setting of a vector-group compensation setting pair corresponding to the pair of previously assigned 3-by-3 compensation matrices to the first and the second plurality of phasors, respectively, to calculate a corresponding first and second set of three test phasors if each of the three-phase operate current values of the baseline set is less than the per-unit threshold value;
   (b) adjusting phase angles of the first set of three test phasors by one-hundred and eighty degrees to yield an adjusted first set of three test phasors;
   (c) comparing an absolute value of a phasor of the adjusted first set of three test phasors to an absolute value of a like-phase phasor of the second set of three test phasors to determine if a phase angle of the phasor of the adjusted first set of three test phasors is within a pre-determined angle range of a phase angle of the like-phase phasor of the second set of three test phasors;

(d) if the phase angle of the phasor of the adjusted first set of three test phasors is within the pre-determined angle range of the phase angle of the like-phase phasor of the second set of three test phasors, iteratively repeating steps (c) through (d) until each phasor of the adjusted first set of three test phasors has been compared to each like-phase phasor of the second set of three test phasors; and (e) if the phase angle of each of the adjusted first set of three test phasors is within the pre-determined angle range of the each of the like-phase phasors of the second set of three test phasors, enabling application of the vector-group compensation setting pair corresponding to the pair of previously assigned 3-by-3 compensation matrices as the operational vector-group compensation setting pair.

37. The method of claim 36, wherein the pre-determined angle range is plus or minus 5 degrees.

38. The method of claim 36, wherein application of the vector-group compensation setting associated with the pair of previously assigned 3-by-3 compensation matrices is enabled after a pre-determined time period.

39. The method of claim 23, wherein the first winding comprises a high voltage winding of the power transformer, and wherein the second winding comprises a low voltage winding of the power transformer.

40. The method of claim 23, wherein the plurality of 3-by-3 compensation matrixes comprises twelve 3-by-3 compensation matrices representing twelve vector-group compensation settings.

41. The method of claim 23, further comprising providing a commissioning report to a commissioning engineer, the commissioning report including at least one of a settings status, a phase rotation setting of the first winding, a phase rotation status of the second winding and before and after operate and restraint current status.

42. The method of claim 23, wherein the differential relay comprises a power transformer differential relay.

43. The method of claim 23, wherein power transformer includes more than two windings, and wherein the method further comprises:
    applying the vector-group compensation setting pair to the first and second plurality of phasors and iteratively calculating another number of test sets of three-phase operate current values and three-phase restraint current values; and
    based on a comparison of each of the three-phase operate current values of the another number of test sets to the per-unit threshold value, selecting one of the plurality of 3-by-3 compensation matrices as another operational vector-group setting, wherein application of the vector-group compensation setting pair to the first and second plurality of phasors and application of the another operational vector-group setting to a third plurality of phasors automatically provides correction for the phase shift occurring between the more than two windings.

44. A method for providing to a microcontroller of a differential relay an operational vector-group compensation setting pair that automatically provides correction for a phase shift occurring between currents of a first winding and a second winding of a power transformer of a three-phase power system, the method comprising:
    based on a first and a second plurality of digitized current sample streams derived from a plurality of secondary currents corresponding to currents of the first winding and the second winding respectively, calculating a corresponding first and a corresponding second plurality of phasors;
    selecting a pair of vector-group compensation settings based on three-phase operate current values calculated using the first and second plurality of phasors, each of the pair of vector-group compensation settings corresponding to a 3-by-3 compensation matrix;
    applying a first vector-group compensation setting of the selected vector-group compensation setting pair to the first plurality of phasors to form a first set of three test phasors and applying a second vector-group compensation setting of the selected vector-group compensation setting pair to the second plurality of phasors to form a second set of three test phasors; and
    after adjusting each of the three test phasors of the first set by one-hundred and eighty degrees to form an adjusted first set of three test phasors and if phase angles of each of the adjusted first set of three test phasors is within a pre-determined angle range of each of the like-phase phasors of the second set of three test phasors, enabling application of the vector-group compensation setting pair as the operational vector-group compensation pair.

45. The method of claim 44, wherein the pre-determined angle range is plus or minus 5 degrees.

46. The method of claim 44, wherein prior to selecting a pair of vector-group compensation settings, performing a number of qualifying checks.

47. The method of claim 46, wherein performing the number of qualifying checks comprises:
    performing polarity checks on the first and the second current transformer groups;
    performing crossed-phase checks on the first and the second current transformer groups; and
    performing ratio checks on the first and the second current transformer groups.

* * * * *